(12) United States Patent
Xie et al.

(10) Patent No.: US 11,508,823 B2
(45) Date of Patent: Nov. 22, 2022

(54) LOW CAPACITANCE LOW RC WRAP-AROUND-CONTACT

(71) Applicant: INTERNATIONAL BUSINESS MACHINES CORPORATION, Armonk, NY (US)

(72) Inventors: Ruilong Xie, Niskayuna, NY (US); Ekmini Anuja De Silva, Slingerlands, NY (US); Jing Guo, Niskayuna, NY (US); Hao Tang, Slingerlands, NY (US); Cheng Chi, Jersey City, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 62 days.

(21) Appl. No.: 17/132,980

(22) Filed: Dec. 23, 2020

(65) Prior Publication Data
US 2022/0199787 A1 Jun. 23, 2022

(51) Int. Cl.
| | |
|---|---|
| H01L 29/417 | (2006.01) |
| H01L 29/40 | (2006.01) |
| H01L 29/45 | (2006.01) |
| H01L 29/66 | (2006.01) |
| H01L 29/786 | (2006.01) |
| H01L 29/08 | (2006.01) |
| H01L 21/265 | (2006.01) |
| H01L 29/06 | (2006.01) |

(Continued)

(52) U.S. Cl.
CPC .... *H01L 29/41733* (2013.01); *H01L 29/0847* (2013.01); *H01L 29/401* (2013.01); *H01L 29/456* (2013.01); *H01L 29/66742* (2013.01); *H01L 29/78696* (2013.01); *H01L 21/26506* (2013.01); *H01L 29/0665* (2013.01); *H01L 29/42392* (2013.01); *H01L 29/4908* (2013.01); *H01L 29/517* (2013.01)

(58) Field of Classification Search
CPC .......... H01L 29/41733; H01L 29/0847; H01L 29/401; H01L 29/456; H01L 29/66742; H01L 29/78696; H01L 21/26506; H01L 29/0665; H01L 29/42392; H01L 29/4908; H01L 29/517
USPC ....................................................... 257/410
See application file for complete search history.

(56) References Cited

U.S. PATENT DOCUMENTS

| | | |
|---|---|---|
| 9,847,390 B1 | 12/2017 | Xie et al. |
| 10,084,094 B1 | 9/2018 | Cheng et al. |

(Continued)

*Primary Examiner* — Tong-Ho Kim
(74) *Attorney, Agent, or Firm* — Tutunjian & Bitetto, P.C.; Samuel Waldbaum

(57) ABSTRACT

A field effect transistor is provided. The field effect transistor includes a first source/drain on a substrate, a second source/drain on the substrate, and a channel region between the first source/drain and the second source/drain. The field effect transistor further includes a metal liner on at least three sides of the first source/drain and/or the second source/drain, wherein the metal liner covers less than the full length of a sidewall of the first source/drain and/or the second source/drain. The field effect transistor further includes a metal-silicide between the metal liner and the first source/drain and/or the second source/drain, and a conductive contact on the metal liner on the first source/drain and/or the second source/drain, wherein the conductive contact is a conductive material different from the conductive material of the metal liner.

20 Claims, 15 Drawing Sheets

(51) Int. Cl.
*H01L 29/423* (2006.01)
*H01L 29/49* (2006.01)
*H01L 29/51* (2006.01)

(56) References Cited

U.S. PATENT DOCUMENTS

| | | |
|---|---|---|
| 10,236,218 B1 | 3/2019 | Xie et al. |
| 10,276,442 B1 * | 4/2019 | Xie ................. H01L 21/823807 |
| 10,367,077 B1 | 7/2019 | Loubet et al. |
| 10,546,957 B2 | 1/2020 | Xu et al. |
| 10,559,656 B2 | 2/2020 | Bourjot et al. |
| 10,586,872 B2 | 3/2020 | Carr et al. |
| 2019/0326395 A1 | 10/2019 | Ando et al. |
| 2020/0235214 A1 * | 7/2020 | Huang .............. H01L 21/76877 |

\* cited by examiner

LOW CAPACITANCE LOW RC WRAP-AROUND-CONTACT

BACKGROUND

The present invention generally relates to a semiconductor contact, and more particularly to a low capacitance wrap-around contact for a source/drain.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a metal-oxide-semiconductor field effect transistor (MOSFET) with a single gate parallel with the plane of the substrate. Depending on the doping of the source and drain, an NFET or a PFET can be formed. Two FETs also can be coupled to form a complementary metal oxide semiconductor (CMOS) circuit, where a p-type MOSFET and n-type MOSFET are coupled together.

SUMMARY

In accordance with an embodiment of the present invention, a field effect transistor is provided. The field effect transistor includes a first source/drain on a substrate, and a second source/drain on the substrate. The field effect transistor further includes a channel region between the first source/drain and the second source/drain. The field effect transistor further includes a metal liner on at least three sides of the first source/drain and/or the second source/drain, wherein the metal liner covers less than the full length of a sidewall of the first source/drain and/or the second source/drain. The field effect transistor further includes a metal-silicide between the metal liner and the first source/drain and/or the second source/drain, and a conductive contact on the metal liner on the first source/drain and/or the second source/drain, wherein the conductive contact is a conductive material different from the conductive material of the metal liner.

In accordance with another embodiment of the present invention, a field effect transistor is provided. The field effect transistor includes a first source/drain on a substrate, a second source/drain on the substrate, and a channel region between the first source/drain and the second source/drain. The field effect transistor further includes a first metal liner on at least three sides of the first source/drain, wherein the first metal liner covers about half (½) to about nine-tenths (9/10) the length of a sidewall of the first source/drain, and a second metal liner on at least three sides of the second source/drain, wherein the second metal liner covers about half (½) to about nine-tenths (9/10) the length of a sidewall of the second source/drain. The field effect transistor further includes a first metal-silicide layer between the first metal liner and the first source/drain, and a second metal-silicide layer between the second metal liner and the second source/drain, wherein the first source/drain and the second source/drain each have amorphized surfaces adjoining the first metal-silicide layer and second metal-silicide layer. The field effect transistor further includes a first conductive contact on the first metal liner on the first source/drain, wherein the first conductive contact is a conductive material different from the conductive material of the first metal liner, and a second conductive contact on the second metal liner on the second source/drain, wherein the second conductive contact is a conductive material different from the conductive material of the second metal liner. The field effect transistor further includes a first cover layer on the first metal liner and first conductive contact, wherein a portion of the first cover layer separates the first metal liner and an isolation region on the substrate.

In accordance with yet another embodiment of the present invention, a method of forming a field effect transistor is provided. The method includes forming a channel region on a substrate. The method further includes forming a first source/drain and a second source/drain on opposite sides of the channel region, and amorphizing the surfaces on at least three sides of the first source/drain and the second source/drain by an ion bombardment. The method further includes forming a first metal liner on at least three sides of the first source/drain and a second metal liner on at least three sides of the second source/drain, and forming a first metal-silicide layer between the first metal liner and the first source/drain, and a second metal-silicide layer between the second metal liner and the second source/drain. The method further includes forming a first cover layer on the first metal liner, wherein a portion of the first cover layer is between the first metal liner and an isolation region on the substrate, and forming a second cover layer on the second metal liner, wherein a portion of the second cover layer is between the second metal liner and the isolation region on the substrate. The method further includes forming a first conductive contact on the first metal liner on the first source/drain and a second conductive contact on the second metal liner on the second source/drain.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a low capacitance wrap-around contact for a source/drain with a low RC time constant, where an RC time constant is the product of the circuit resistance times the capacitance in seconds. By controlling the amount of interfacial contact area between a semiconductor source/drain and a conductive contact, the resistance and capacitance can be balanced, where a larger contact area reduces resistance but increases the volume of the conductor and the capacitance. By controlling the amorphization of the source/drain semiconductor surface, the contact resistance between the wrap-around contact, interfacial silicide, and semiconductor source/drain can be reduced for top and side surfaces of the source/drain compared to surfaces that have not been amorphized prior to contact and/or silicide formation. Increased amorphization of the source/drain surface can reduce the insulator area and resistance at the interface with the metal contact and the thereby reduce the RC time constant.

Embodiments of the present invention provide a low capacitance wrap-around contact for a source/drain with a high source/drain to conductive contact surface area to minimize resistance, while reducing the wrap-around contact thickness on the sidewalls of the source/drain to minimize parasitic capacitance.

Embodiments of the present invention provide a low contact resistance interface along the sidewalls of the source/drain as well as source/drain surfaces facing a contact via opening. An surface bombardment of all the exposed surfaces of the source/drain can provide amorphized surfaces for forming a contact silicide and interface. Sidewall amorphization can be difficult with a source/drain channel surrounded by a dielectric because of limited line of sight exposure for amorphization bombardment.

Embodiments of the present invention provide a two component source/drain contact, including a lower portion conductive liner adjacent to the source/drain sidewalls and an upper portion conductive contact plug.

Exemplary applications/uses to which the present invention can be applied include, but are not limited to: logic device, memory device, analog devices, image sensing devices, and other devices utilizing MOSFET technology.

It is to be understood that aspects of the present invention will be described in terms of a given illustrative architecture; however, other architectures, structures, substrate materials and process features and steps can be varied within the scope of aspects of the present invention.

Figure 1:
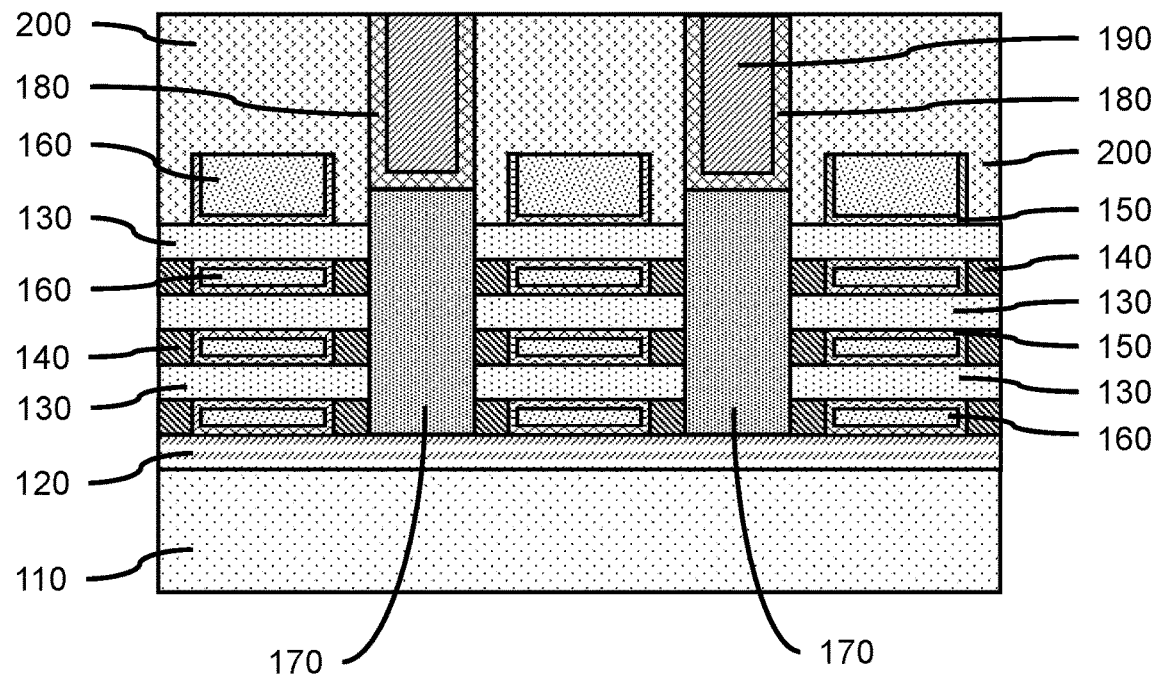
FIG. 1 is a cross-sectional side view showing nanosheet field effect transistor devices with source/drains and sacrificial fill layer, in accordance with an embodiment of the present invention.

Referring now to the drawings in which like numerals represent the same or similar elements and initially to FIG. 1, a cross-sectional side view showing nanosheet field effect transistor devices with source/drains and sacrificial fill layer is shown, in accordance with an embodiment of the present invention.

In one or more embodiments, a field effect transistor device can be formed on a substrate 110, where the field effect transistor device can have one or more source/drains 170 and a conductive source/drain contact to the one or more of the source/drains. The field effect transistor device can have at least one source/drain 170 with a top surface and sidewalls on which a wrap-around contact can be formed.

In various embodiments, the field effect transistor device can be a vertical transport fin field effect transistor device, a horizontal transport fin field effect transistor device, a nanowire field effect transistor device, or a nanosheet field effect transistor device, where the transistor device has at least one source/drain with sidewalls that a conductive contact can be formed on. The figures depict a nanosheet transistor device for the purpose of illustration; however, these other device architectures are also contemplated as within the scope of the invention.

In one or more embodiments, the field effect transistor device can be a nanosheet field effect transistor device formed on a substrate 110, where the nanosheet field effect transistor device can include an electrically insulating bottom spacer layer 120, one or more nanosheet channel layers 130 above the insulating bottom spacer layer 120, and insulating recess fills 140 above and/or below opposite edges of the one or more nanosheet channel layers 130 to separate a wrap-around gate structure, including a gate dielectric layer 150 and a conductive gate fill 160, from adjoining source/drains 170. The insulating recess fill 140 can also be adjacent to a wrap-around gate structure on the nanosheet channel layers 130 and electrically separate the gate structure from the source/drains 170. A protective liner 180, which can be a contact etch stop layer (CESL) can be formed on the exposed surfaces of the source/drains 170 and on the sidewalls of the gate cap 200. A sacrificial fill layer 190 can be formed on the protective liner 180 and substrate 110, where the sacrificial fill layer 190 can be a dielectric material that can be selectively removed relative to the protective liner 180 and a gate cap 200 formed over the gate structure and nanosheet channel layers 130. A nanosheet FET device can have a device channel which includes one or more nanosheet channel layers 130 in a stacked configuration with a gate structure disposed between the one or more nanosheet channel layers 130.

While the present figures depict a nanosheet transistor device with nanosheet channel layers 130 forming the channel region of the device, other device architecture(s) having a single monolithic channel region, for example, a vertical or horizontal transport fin field effect transistor, the embodiments of the present invention can also apply and utilize the inventive features described herein. Field effect transistor devices with source/drains adjacent to gate structures can have a wrap-around source/drain contact including a metal liner with a thickness that minimizes the parasitic capacitance between the gate structure and the source/drain(s).

In various embodiments, the gate dielectric layer 150 can be an insulating dielectric material, including, but not limited to, silicon oxide (SiO), high-k dielectric materials, and a combination thereof. The high-k dielectric materials can include dielectric materials having a dielectric constant greater than silicon dioxide ($SiO_2$), for example, hafnium oxide (HfO), zirconium oxide (ZrO), tantalum oxide (TaO), titanium oxide (TiO), etc.

In various embodiments, the conductive gate fill 160 can be a conductive material, including, but not limited to metals (e.g., copper (Cu), Cobalt (Co), tungsten (W), molybdenum (Mo), titanium-aluminum (TiAl), etc.), metal compounds (e.g., titanium nitride (TiN), tantalum nitride (TaN), tungsten nitride (WN), hafnium nitride (HfN), titanium carbide (TiC), tantalum carbide (TaC), tungsten carbide (WC), hafnium carbide (HfC), amorphous silicon (a-Si), conductive carbon (e.g., graphene, carbon nanorods, etc.), titanium aluminum carbide (TiAlC), and combinations thereof.

Figure 2:
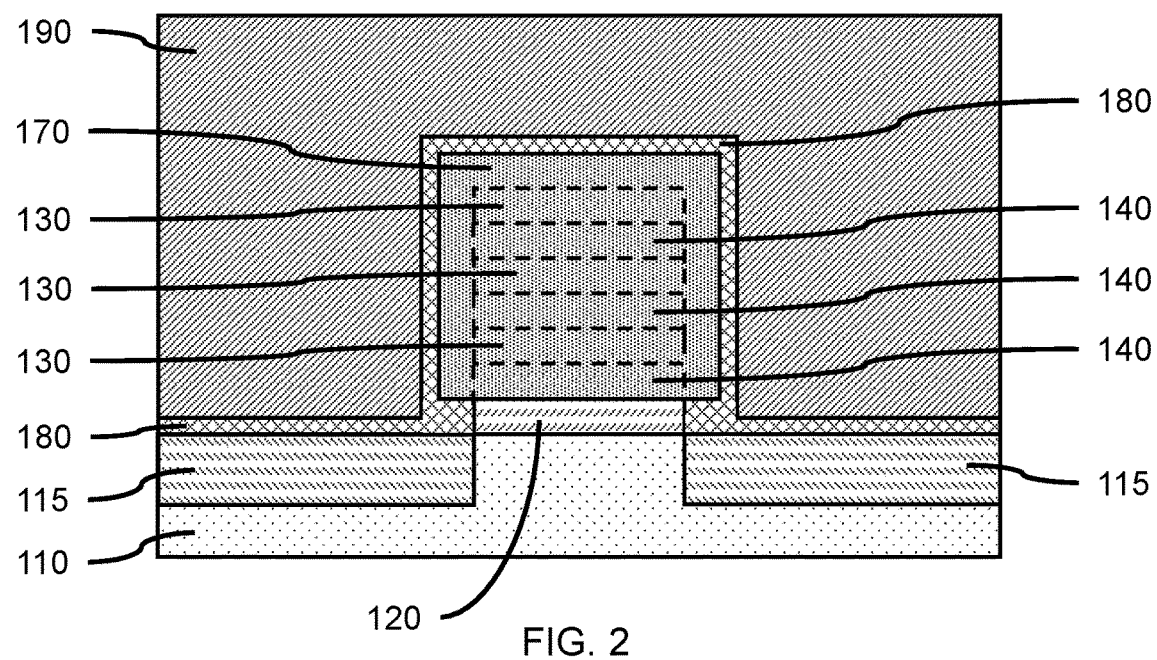
FIG. 2 is a cross-sectional side view through the source/drain region of the nanosheet device perpendicular to FIG. 1 showing the nanosheet field effect transistor devices with source/drains and a protective liner, in accordance with an embodiment of the present invention.

FIG. 2 is a cross-sectional side view through the source/drain region of the nanosheet device perpendicular to FIG. 1 showing the nanosheet field effect transistor devices with source/drains and a protective liner, in accordance with an embodiment of the present invention.

In one or more embodiments, the protective liner 180 can be formed on a portion of the source/drains 170, a portion of the isolation region 115, and a portion of the insulating bottom spacer layer 120. The insulating bottom spacer layer 120 can be on a portion of the substrate 110 below a stack of nanosheet channel layers 130 and between isolation regions 115, such that the insulating bottom spacer layer 120 physically separates and electrically isolates the nanosheet channel layers 130 and wrap-around gate structure from the substrate 110. In various embodiments, the protective liner 180 can be on at least three sides or at least four sides of a source/drain 170. The sacrificial fill layer 190 can be on the protective liner 180 and at least three sides of source/drain 170.

In one or more embodiments, the substrate 110 can be a semiconductor material, including, but not limited to, a type IV semiconductor, for example, silicon (Si) and germanium (Ge), a IV-IV compound semiconductor, for example, silicon-germanium (SiGe) and silicon carbide (SiC), a III-V compound semiconductor, for example, gallium arsenide (GaAs), gallium nitride (GaN), indium phosphide (InP), II-VI compound semiconductor, for example, cadmium selenide (CdSe) and zinc sulfide (ZnS), and combinations thereof. The substrate 110 can be a semiconductor-on-insulator (SeOI) substrate, for example a silicon-on-insulator (SOI) substrate having a buried oxide layer.

In one or more embodiments, an isolation region 115 can be formed in the substrate 110, where the isolation region 115 can be a shallow trench isolation region that electrically insulates the device from the substrate and neighboring devices. An isolation region 115 can be on opposite sides of the source/drains 170 and a portion of the substrate 110 below insulating bottom spacer layer 120. The isolation region 115 can be an electrically insulating dielectric material, including, but not limited to, silicon oxide (SiO), silicon nitride (SiN), silicon oxynitride (SiON), silicon carbide (SiC) silicon oxycarbide (SiOC), silicon carbonitride (SiCN), silicon oxy carbonitride (SiOCN), silicon boro carbonitride (SiBCN), and combinations thereof.

In various embodiments, the insulating bottom spacer layer 120 can be formed on a portion of the substrate 110, where the insulating bottom spacer layer 120 can be electrically isolate an overlying device, including a gate structure and source/drains 170 from the substrate 110. In various embodiments, the insulating bottom spacer layer 120 can be an insulating dielectric material, including, but not limited to, silicon oxide (SiO), silicon nitride (SiN), silicon oxynitride (SiON), silicon carbide (SiC) silicon oxycarbide (SiOC), silicon carbonitride (SiCN), silicon oxy carbonitride (SiOCN), silicon boro carbonitride (SiBCN), and combinations thereof.

In various embodiments, the nanosheet channel layers 130 can be formed between and electrically connected to source/drains 170, where the nanosheet channel layers 130 can be a semiconductor material, including, but not limited to, a type IV semiconductor, for example, silicon (Si) and germanium (Ge), a IV-IV compound semiconductor, for example, silicon-germanium (SiGe) and silicon carbide (SiC), a III-V compound semiconductor, for example, gallium arsenide (GaAs), gallium nitride (GaN), indium phosphide (InP), II-VI compound semiconductor, for example, cadmium selenide (CdSe) and zinc sulfide (ZnS), and combinations thereof.

In various embodiments, the insulating recess fill 140 can be an insulating dielectric material, including, but not limited to, silicon oxide (SiO), silicon nitride (SiN), silicon oxynitride (SiON), silicon carbide (SiC) silicon oxycarbide (SiOC), silicon carbonitride (SiCN), silicon oxy carbonitride (SiOCN), silicon boro carbonitride (SiBCN), and combinations thereof.

In various embodiments, the source/drains 170 can be a semiconductor material, including, but not limited to, a type IV semiconductor, for example, silicon (Si) and germanium (Ge), a IV-IV compound semiconductor, for example, silicon-germanium (SiGe) and silicon carbide (SiC), a III-V compound semiconductor, for example, gallium arsenide (GaAs), gallium nitride (GaN), indium phosphide (InP), II-VI compound semiconductor, for example, cadmium selenide (CdSe) and zinc sulfide (ZnS), and combinations thereof. The source/drains 170 can be formed on the endwall surfaces of the nanosheet channel layers 130, for example, by an epitaxial growth process, where the source/drains can be n-doped, for example, using boron (B), gallium (Ga), or indium (In), or p-doped, for example, using phosphorus (P), arsenic (As), or antimony (Sb), to form an NFET or PFET, respectively.

In various embodiments, the protective liner 180 can be an insulating dielectric material, including, but not limited to, silicon oxide (SiO), silicon nitride (SiN), silicon oxynitride (SiON), silicon carbide (SiC) silicon oxycarbide (SiOC), silicon carbonitride (SiCN), silicon oxy carbonitride (SiOCN), silicon boro carbonitride (SiBCN), and combinations thereof. The material of the protective liner 180 can be selectively etchable relative to the other insulating dielectric materials that may be exposed during processing.

In various embodiments, the sacrificial fill layer 190 can be an insulating dielectric material, including, but not limited to, silicon oxide (SiO), silicon nitride (SiN), silicon oxynitride (SiON), a low-k dielectric material having a dielectric constant less than silicon (Si) (e.g., fluorine-doped silicon oxide (SiO:F), carbon-doped silicon oxide (SiO:C), etc.), amorphous carbon (a-C), and combinations thereof. The material of the sacrificial fill layer 190 can be selectively etchable relative to the other insulating dielectric materials, including the protective liner 180 and gate cap 200, that may be exposed during processing.

In various embodiments, the gate cap 200 can be an insulating dielectric material, including, but not limited to, silicon oxide (SiO), silicon nitride (SiN), silicon oxynitride (SiON), silicon boro carbonitride (SiBCN), silicon oxycarbide (SiOC), and combinations thereof.

Figure 3:
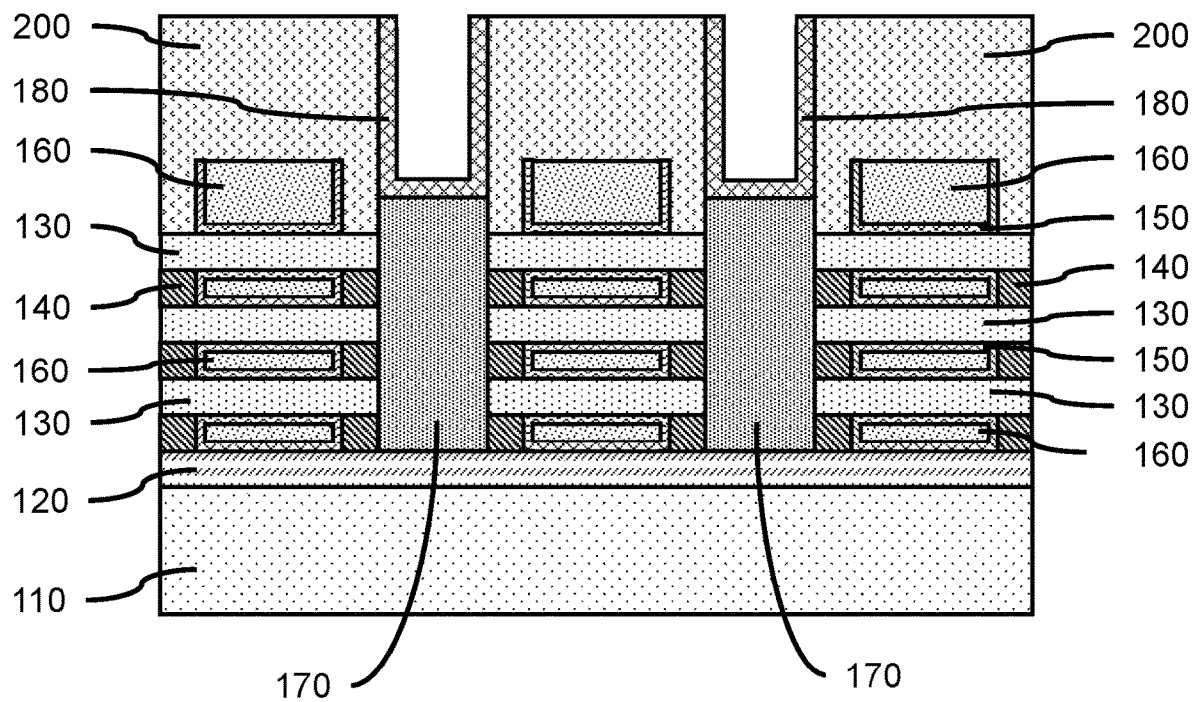
FIG. 3 is a cross-sectional side view showing nanosheet field effect transistor devices with source/drains after removing the sacrificial fill layer, in accordance with an embodiment of the present invention.

FIG. 3 is a cross-sectional side view showing nanosheet field effect transistor devices with source/drains after removing the sacrificial fill layer, in accordance with an embodiment of the present invention.

In one or more embodiments, the sacrificial fill layer 190 can be removed from between the walls of the protective liner 180 on the source/drains 170 and gate cap 200, where the sacrificial fill layer 190 can be removed using a selective etch, for example, a selective wet chemical etch, selective dry plasma etch, or combination thereof. The material of the sacrificial fill layer 190 can be different from the gate cap 200 and protective liner 180 to allow the sacrificial fill layer 190 to be selectively removed.

Figure 4:
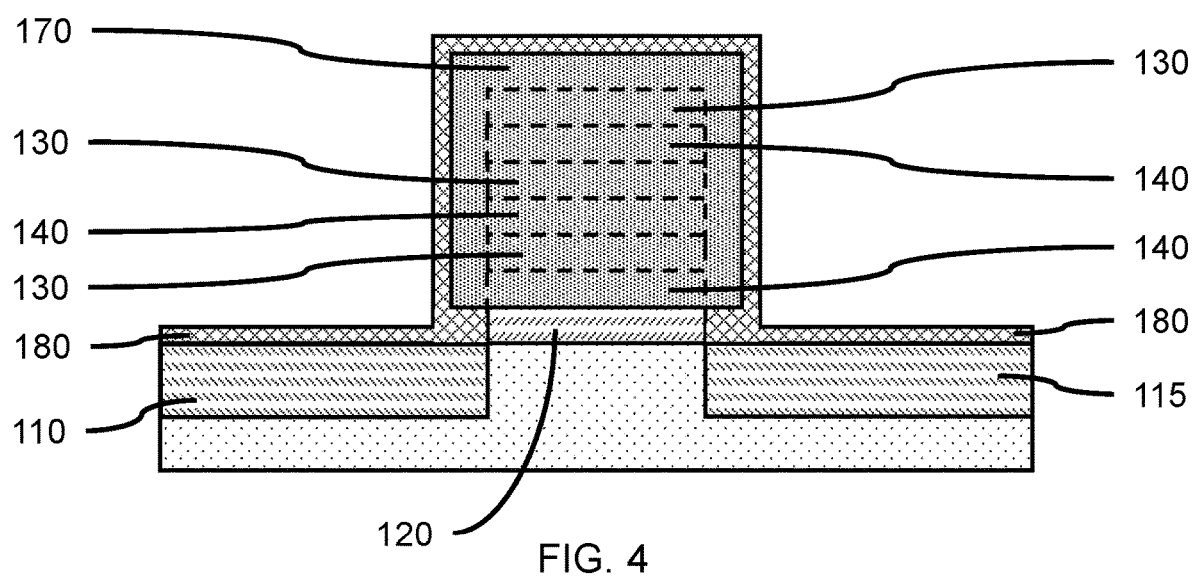
FIG. 4 is a cross-sectional side view perpendicular to FIG. 3 nanosheet field effect transistor devices with source/drains after removing the sacrificial fill layer, in accordance with an embodiment of the present invention.

FIG. 4 is a cross-sectional side view perpendicular to FIG. 3 showing the nanosheet field effect transistor devices with source/drains after removing the sacrificial fill layer, in accordance with an embodiment of the present invention.

In one or more embodiments, removal of the sacrificial fill layer 190 can expose portions of the protective liner 180 on the isolation regions 115, and the top and sides of the source/drains 170.

Figure 5:
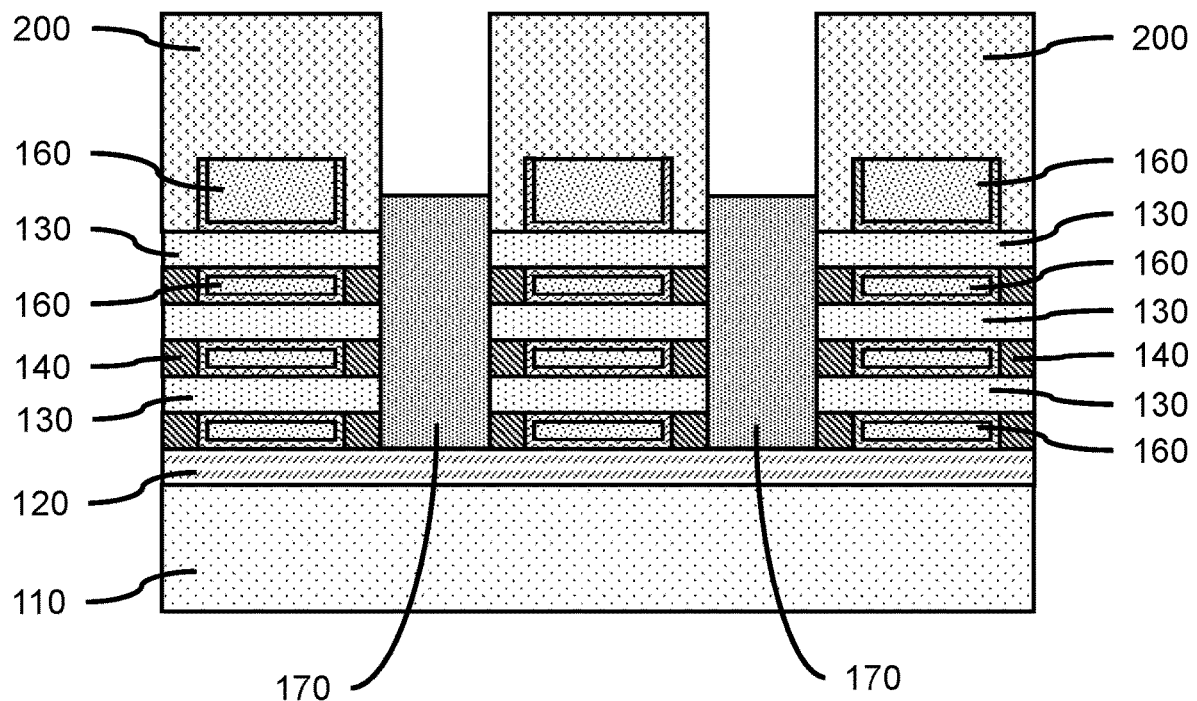
FIG. 5 is a cross-sectional side view showing nanosheet field effect transistor devices with source/drains after removing exposed portions of the protective liner, in accordance with an embodiment of the present invention.

FIG. 5 is a cross-sectional side view showing nanosheet field effect transistor devices with source/drains after removing exposed portions of the protective liner, in accordance with an embodiment of the present invention.

In one or more embodiments, exposed portions of the protective liner 180 can be removed from between the walls of the gate cap 200, where the protective liner 180 can be removed using a selective etch. Removal of the protective liner 180 can expose a top surface of the source/drain(s) 170. The material of the protective liner 180 can be different from the gate cap 200 and source/drains 170 to allow the protective liner 180 to be selectively removed.

Figure 6:
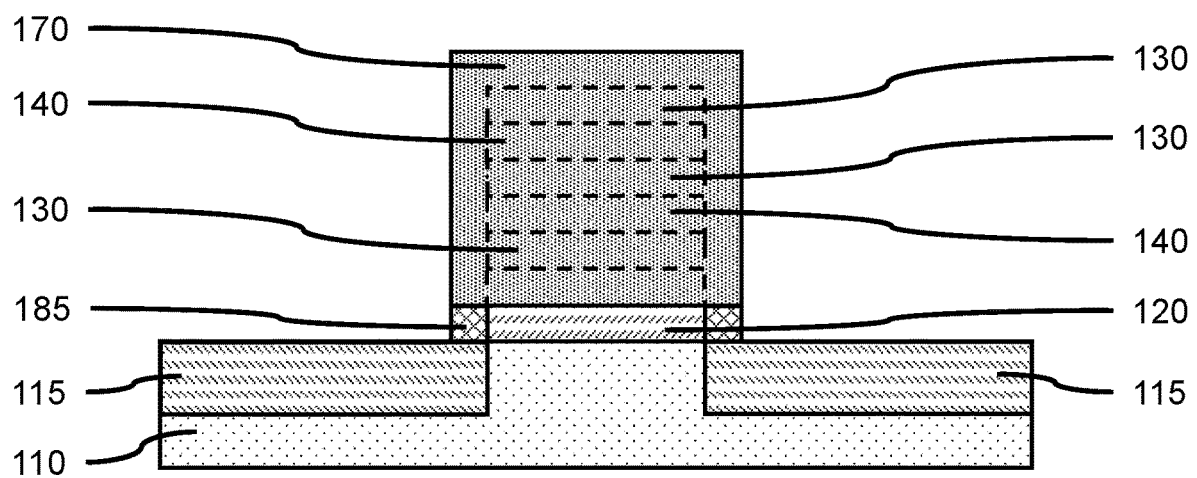
FIG. 6 is a cross-sectional side view perpendicular to FIG. 5 showing the nanosheet field effect transistor devices with source/drains after removing exposed portions of the protective liner, in accordance with an embodiment of the present invention.

FIG. 6 is a cross-sectional side view perpendicular to FIG. 5 showing the nanosheet field effect transistor devices with source/drains after removing exposed portions of the protective liner, in accordance with an embodiment of the present invention.

Removal of portions of the protective liner 180 exposed by removal of the sacrificial fill layer 190 can also expose the sidewall surfaces of the source/drain(s) 170. In various embodiments, removing exposed portions of the protective liner 180 can leave protective blocks 185 between an edge portion of the source/drains 170 and the isolation region 115, where the protective blocks 185 can be on opposite sides of the insulating bottom spacer layer 120. The protective blocks 185 can fill in the divots between the source/drain epitaxial features 170 and the isolation regions 115 and substrate 110.

In various embodiments, an anneal can be used to activate the dopant(s) in the source/drains 170, where the anneal can be a laser spike anneal to recrystallize the source/drains 170 and activate the dopant(s).

Figure 7:
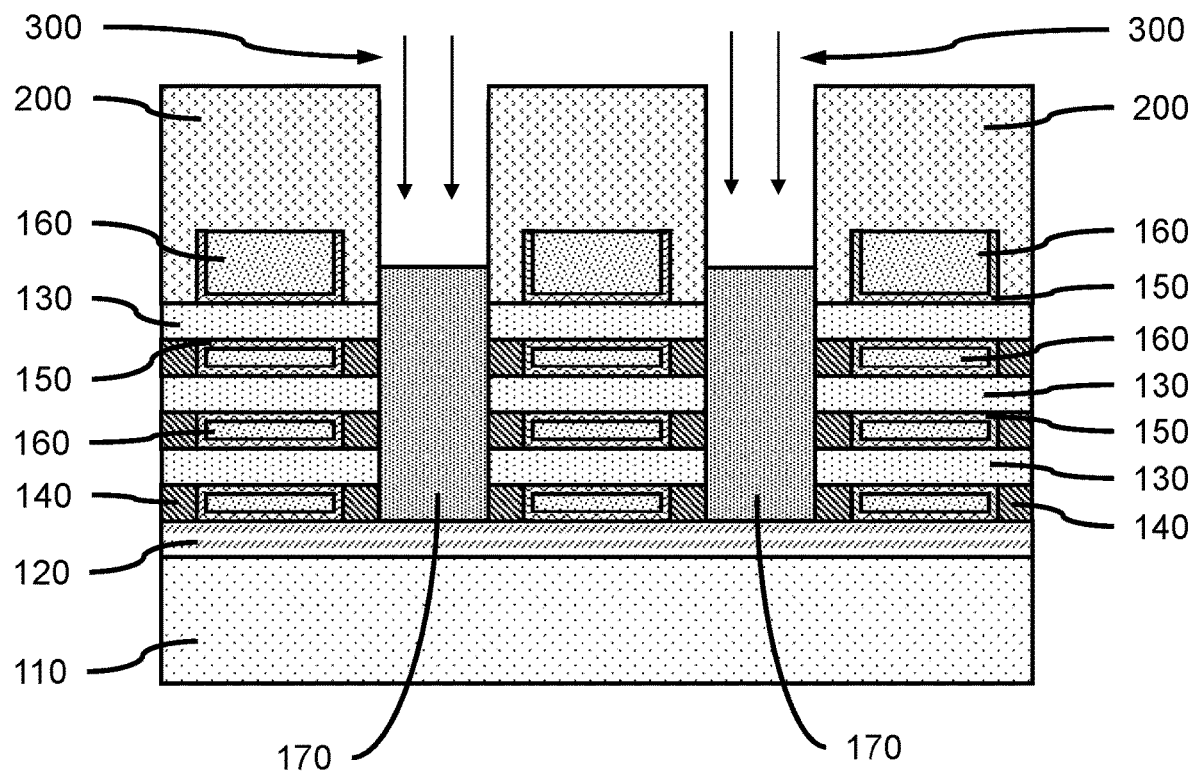
FIG. 7 is a cross-sectional side view showing amorphization of the source/drains through bombardment, in accordance with an embodiment of the present invention.

FIG. 7 is a cross-sectional side view showing amorphization of the source/drains through bombardment, in accordance with an embodiment of the present invention.

In one or more embodiments, the surfaces of the source/drains 170 can be amorphized, where amorphization can be accomplished by an ion bombardment 300. In various embodiments, the ion bombardment 300 can use silicon (Si), germanium (Ge), or other major semiconductor component forming the source/drains 170 as the bombardment species. In various embodiments, the ions can have an energy in a range of about 0.1 kilo electron volts (keV) to about 25 keV, or about 1 keV to about 6 keV, or about 2 keV to about 4 keV, where the ions have sufficient energy to disrupt the crystal lattice of the source/drains 170 to a depth of at least 1 nanometer (nm) to about 15 nm, or about 3 nm to about 10 nm, although other depths are also contemplated.

Figure 8:
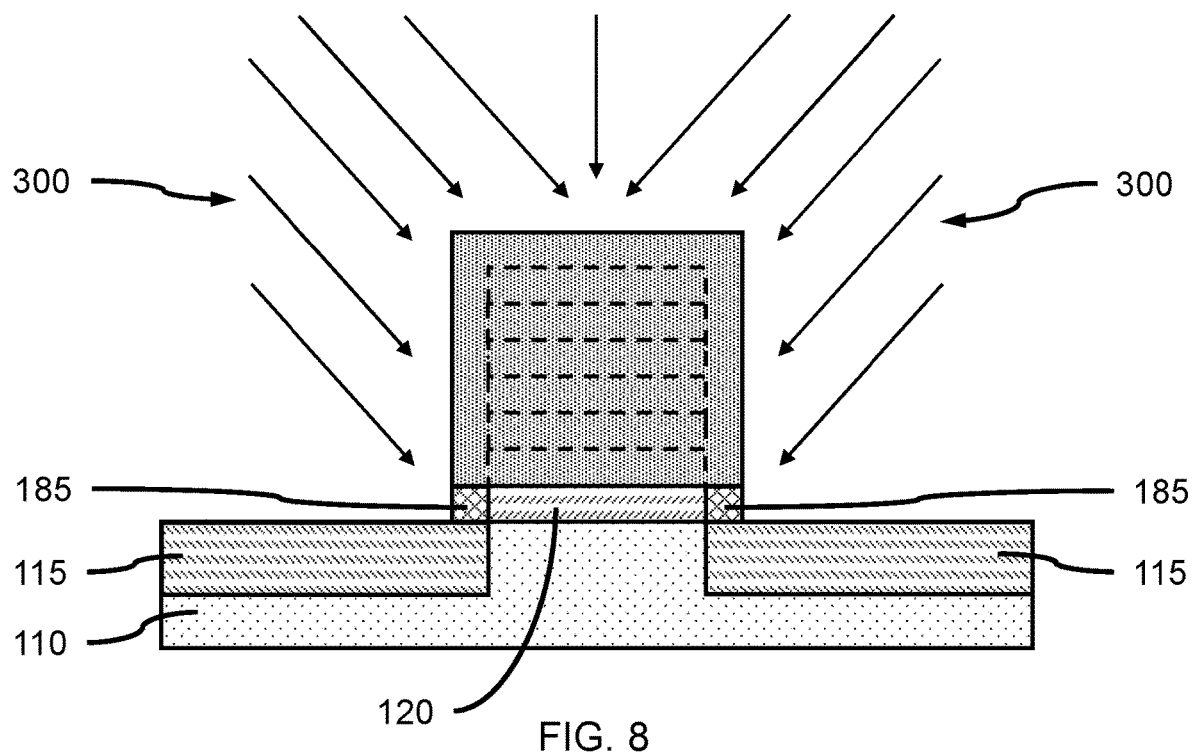
FIG. 8 is a cross-sectional side view perpendicular to FIG. 7 showing amorphization of the source/drains through bombardment, in accordance with an embodiment of the present invention.

FIG. 8 is a cross-sectional side view perpendicular to FIG. 7 showing amorphization of the source/drains through bombardment, in accordance with an embodiment of the present invention.

In one or more embodiments, each of the exposed sides of the source/drains 170 can be exposed to the bombarding species, so the opposite sidewalls of the source/drains 170, as well as the top surface, of the source/drains 170 become amorphized.

Figure 9:
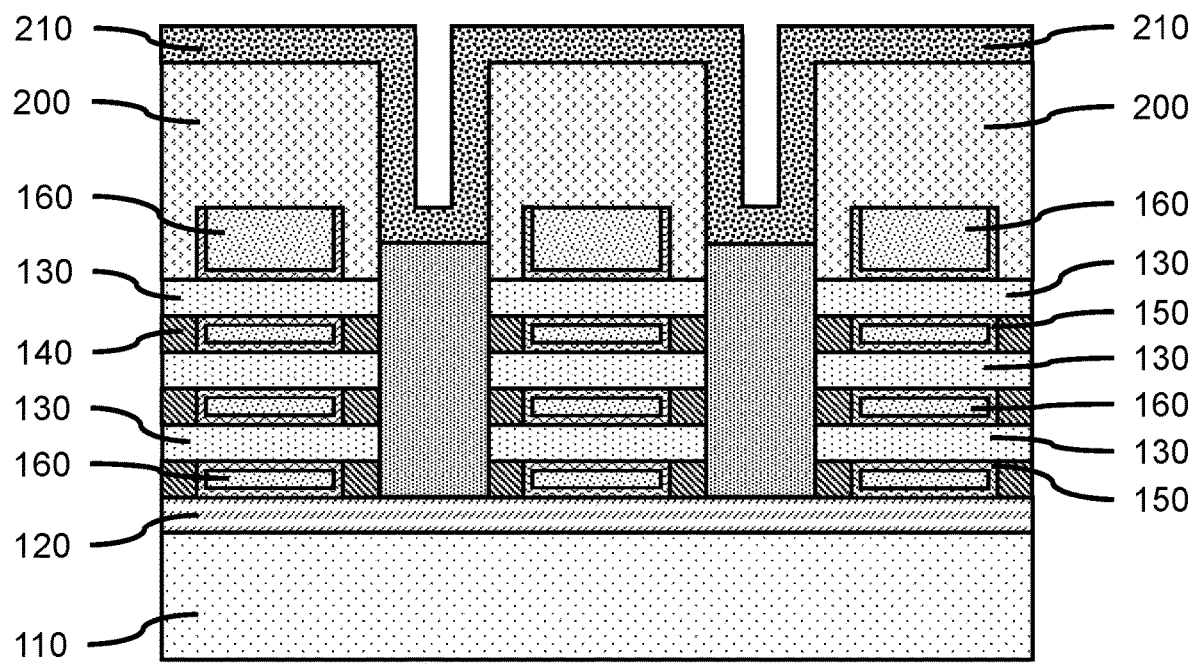
FIG. 9 is a cross-sectional side view showing nanosheet field effect transistor devices with a metal liner on the amorphized surfaces of the source/drains, in accordance with an embodiment of the present invention.

FIG. 9 is a cross-sectional side view showing nanosheet field effect transistor devices with a metal liner on the amorphized surfaces of the source/drains, in accordance with an embodiment of the present invention.

In one or more embodiments, a metal liner 210 can be formed on the top surfaces and sidewalls of the gate cap 200 and on the exposed surfaces of the source/drains 170, where the metal liner 210 can be formed by a conformal deposition, for example, atomic layer deposition (ALD), plasma enhanced ALD (PEALD), or low pressure metal-organic chemical vapor deposition (LP-MOCVD), so a uniform thickness of the metal liner 210 can be deposited on the exposed surfaces.

In various embodiments, the metal liner 210 can be a conductive metal that can form a silicide, including, but not limited to, titanium (Ti), nickel (Ni), nickel-platinum (NiPt), and combinations thereof.

In various embodiments, the metal liner 210 can have a thickness, a, in a range of about 2 nanometers (nm) to about 15 nm, or about 3 nm to about 12 nm, or about 4 nm to about 8 nm, where the thickness of the metal liner 210 is sufficient to form a metal-silicide at the surface of the source/drains 170. The thickness of the metal liner 210 can be uniform on each of the at least three sides of source/drain 170.

In various embodiments, the metal-silicide layer 215 can have a thickness in a range of about 2 nanometers (nm) to about 15 nm, or about 3 nm to about 12 nm, or about 4 nm to about 8 nm, or about 2 nm to about 6 nm although other thicknesses are also contemplated. The metal-silicide layer 215 can have a thickness less than or equal to the thickness of the metal liner 210. The metal-silicide layer can be formed when the metal liner 210 is deposited on the source/drains 170 or during a subsequent thermal processes, where the metal liner can form the metal-silicide layer 215.

Figure 10:
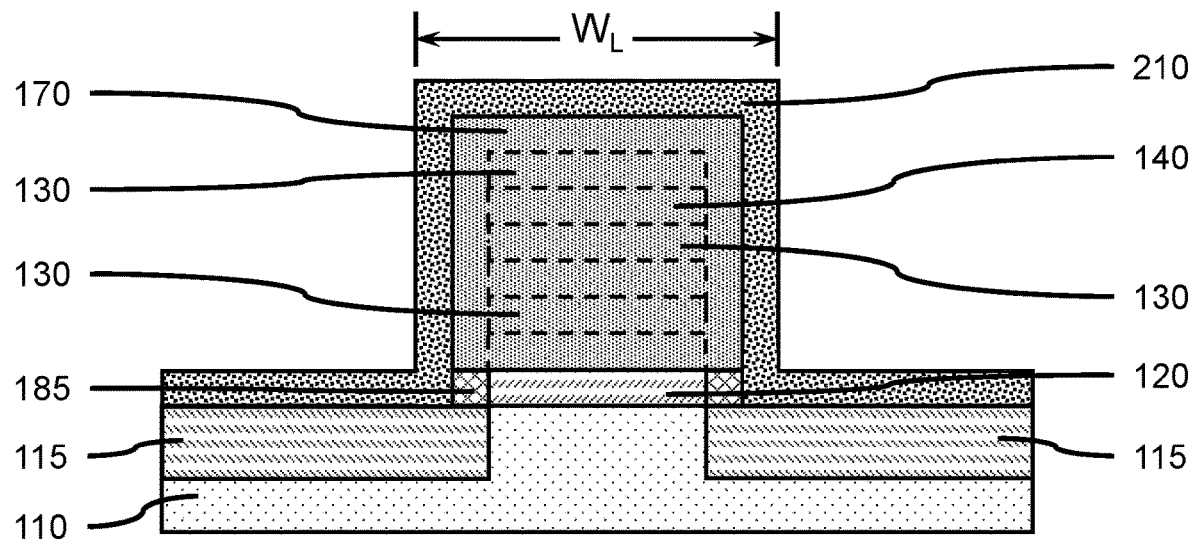
FIG. 10 is a cross-sectional side view perpendicular to FIG. 9 showing the metal liner on the top and sidewall surfaces of the source/drain, in accordance with an embodiment of the present invention.

FIG. 10 is a cross-sectional side view perpendicular to FIG. 9 showing the metal liner on the top and sidewall surfaces of the source/drain, in accordance with an embodiment of the present invention.

In various embodiments, the metal liner 210 can cover the opposite sidewalls of the source/drains 170 with a uniform thickness, a, to provide a minimal parasitic capacitance between the source/drains 170 and the adjacent gate(s) by reducing the volume of conductor maintaining a charge adjacent to the source/drains 170.

Where the sidewall surfaces of the source/drains 170 have been amorphized, there is a lower contact resistance at the interface than if no amorphization was conducted. With the surface(s) pre-amorphized, the subsequent implant of dopant (e.g. B) can be better retained at the surface of the source/drains 170, and a higher dopant concentration at surface can lead to lower contact resistance once a metal-silicide layer 215 is formed at the interface. The lower contact resistance can reduce the capacitance at the interface.

In various embodiments, the metal liner 210 has a width, $W_L$, on the top surface of the source/drain 170, where the width of the metal liner 210 can be greater than the width of the source/drain 170. The width of the metal liner 210 can be the width of the source/drain 170, plus twice (2×) the thickness of the metal liner 210.

Figure 11:
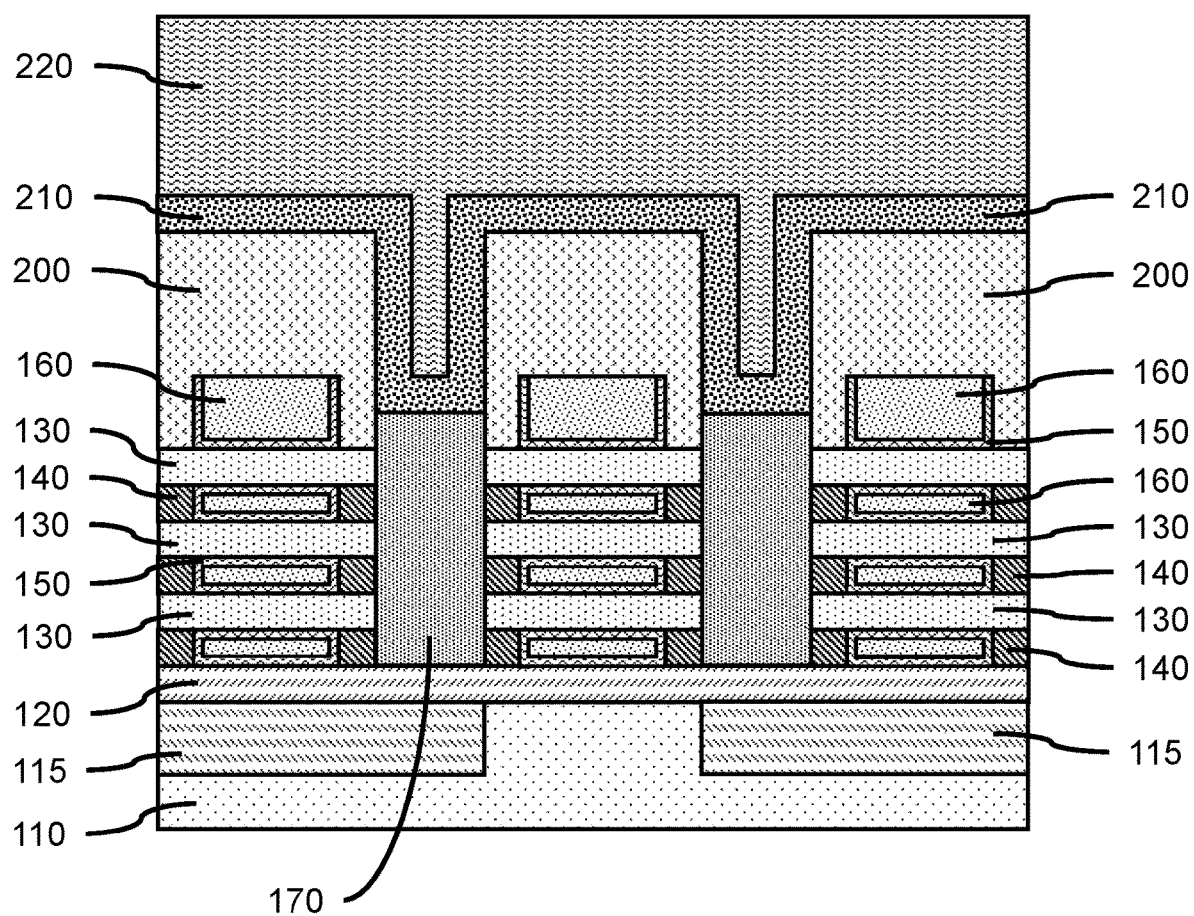
FIG. 11 is a cross-sectional side view showing nanosheet field effect transistor devices with a planarization layer formed on the metal liner, in accordance with an embodiment of the present invention.

FIG. 11 is a cross-sectional side view showing nanosheet field effect transistor devices with a planarization layer formed on the metal liner, in accordance with an embodiment of the present invention.

In one or more embodiments, a planarization layer 220 can be formed on the metal liner 210, where the planarization layer 220 can be formed by a spin-on process or conformal deposition (e.g., ALD, PEALD), so the planarization layer 220 fills in the space between the portions of the metal liner 210 on the source/drains 170 and gate cap 200. The planarization layer 220 can fill in the gaps and provide a uniform flat surface.

In various embodiments, the planarization layer 220 can be an organic planarization layer (OPL).

Figure 12:
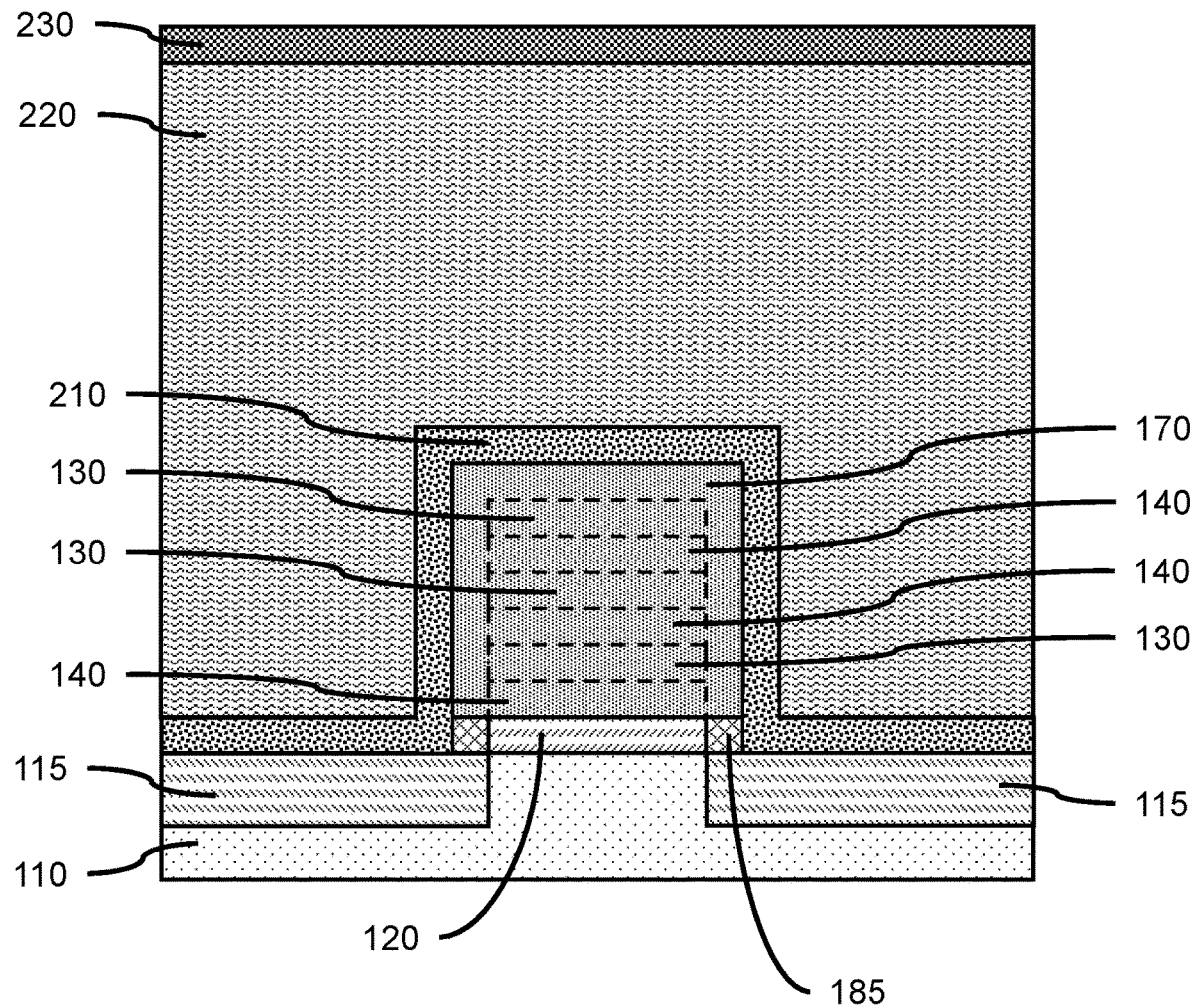
FIG. 12 is a cross-sectional side view showing nanosheet field effect transistor devices with an anti-reflection coating (ARC) layer formed on the planarization layer, in accordance with an embodiment of the present invention.

FIG. 12 is a cross-sectional side view showing nanosheet field effect transistor devices with an anti-reflection coating (ARC) layer formed on the planarization layer, in accordance with an embodiment of the present invention.

In one or more embodiments, an anti-reflection coating (ARC) layer 230 can be formed on the planarization layer 220. The anti-reflection coating (ARC) layer 230 can subsequently be patterned using lithographic methods and etching.

Figure 13:
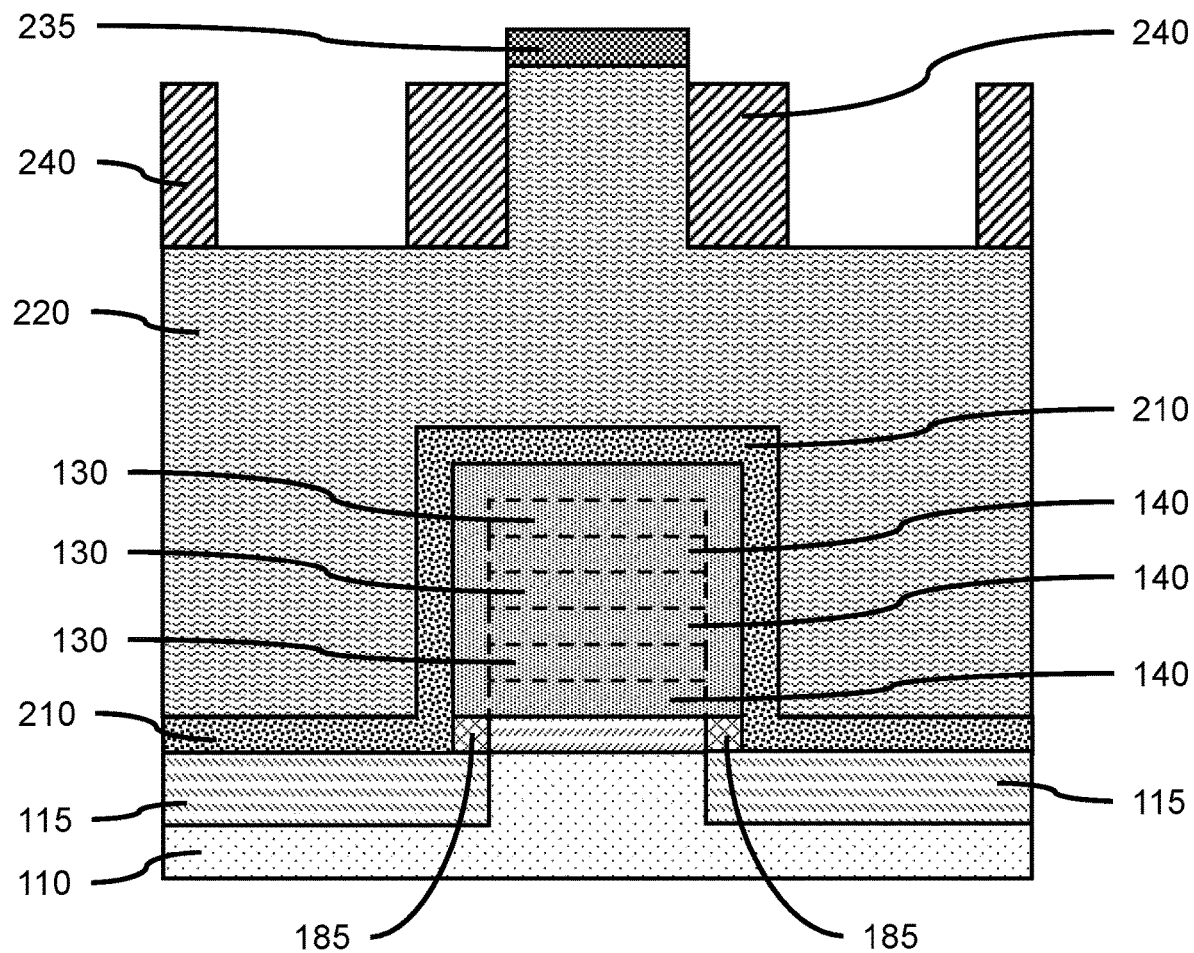
FIG. 13 is a cross-sectional side view showing nanosheet field effect transistor devices with a patterned anti-reflection coating (ARC) template formed on the planarization layer above the source/drains, and sidewall spacers, in accordance with an embodiment of the present invention.

In various embodiments, the anti-reflection coating (ARC) layer 230 can be SiARC, TiARC, or other materials like SiO2, TiOx, SiN, etc FIG. 13 is a cross-sectional side view showing nanosheet field effect transistor devices with a patterned anti-reflection coating (ARC) template formed on the planarization layer above the source/drains, and sidewall spacers, in accordance with an embodiment of the present invention.

In various embodiments, the anti-reflection coating (ARC) layer 230 can be patterned to form an anti-reflection coating (ARC) template 235 above the source/drains 170. A directional etch, for example, a reactive ion etch (RIE), can be used to removed portions of the planarization layer 220 not covered by the anti-reflection coating (ARC) template 235.

In one or more embodiments, sidewall spacers 240 can be formed on the planarization layer 220, including adjacent to a portion of the planarization layer 220 remaining below the anti-reflection coating (ARC) template 235.

In various embodiments, the sidewall spacers 240 can be formed by depositing a conformal sidewall spacer layer on the exposed surfaces, followed by an anisotropic etch. The sidewall spacer layer and sidewall spacers 240 can be a dielectric material, including, but not limited to, titanium oxide (TiO), silicon nitride (SiN), low temperature oxide (LTO), etc. The sidewall spacers 240 can have a width in a range of about 5 nm to about 30 nm, where the width of the sidewall spacers 240 can be sufficient to extend beyond the sides of the source/drains 170.

Figure 14:
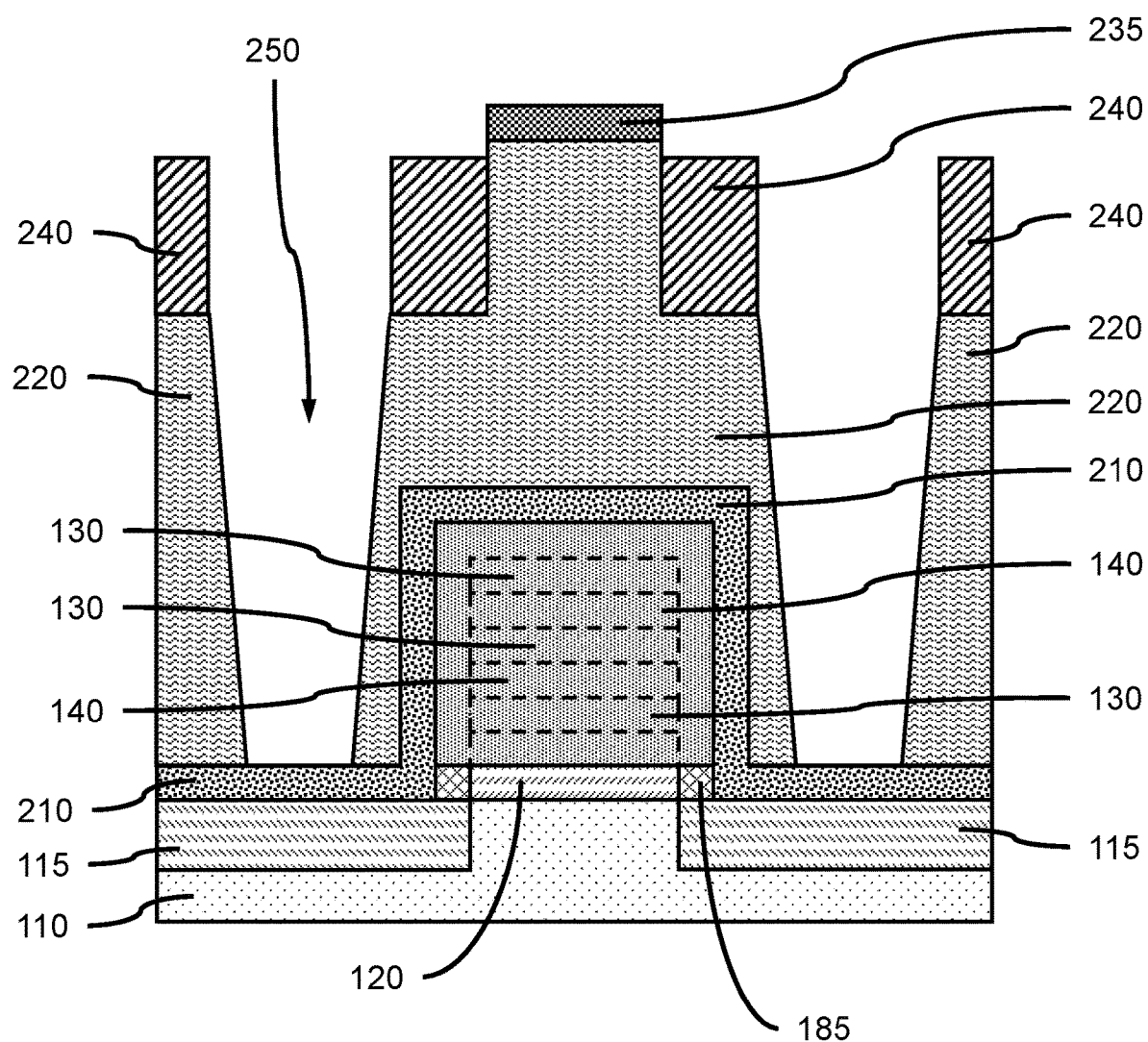
FIG. 14 is a cross-sectional side view showing nanosheet field effect transistor devices with trenches formed in the planarization layer between the sidewall spacers, in accordance with an embodiment of the present invention.

FIG. 14 is a cross-sectional side view showing nanosheet field effect transistor devices with trenches formed in the planarization layer between the sidewall spacers, in accordance with an embodiment of the present invention.

In one or more embodiments, the sidewall spacers 240 can function as masks for formation of one or more trenches 250 formed into the planarization layer 220. The trenches 250 can be formed in the planarization layer 220 using a directional etch (e.g., RIE), where the trenches 250 can expose a portion of the metal liner 210 on the insolation regions 115. The opening of the trench(es) 250 can be adjacent to opposite sides of the source/drains 170. A portion of the planarization layer 220 on the metal liner 210 on the source/drain 170 can form a sidewall of the trench 250.

Figure 15:
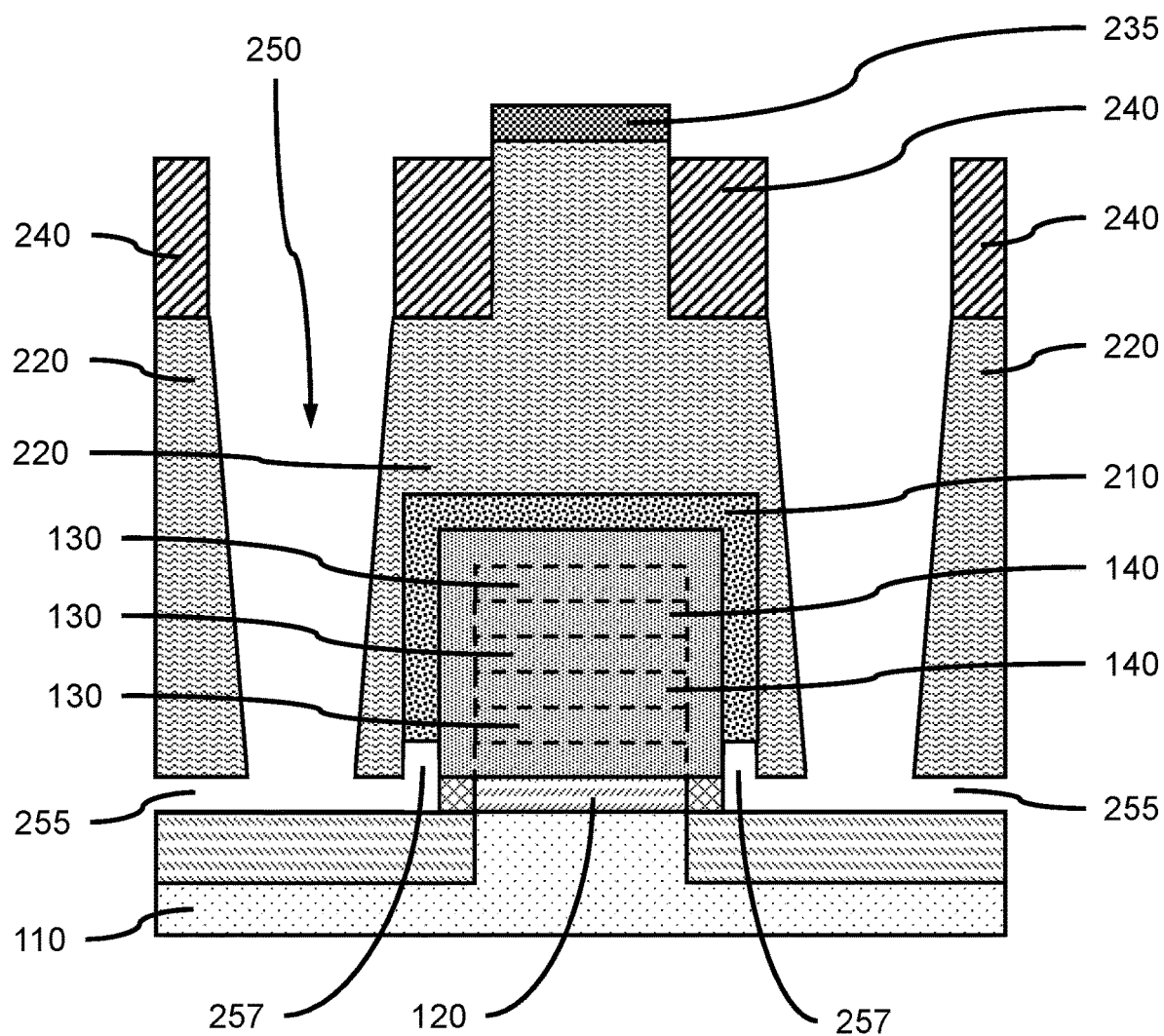
FIG. 15 is a cross-sectional side view showing a portion of the metal liner removed to form channels adjacent to the source/drains, in accordance with an embodiment of the present invention.

FIG. 15 is a cross-sectional side view showing a portion of the metal liner removed to form channels adjacent to the source/drains, in accordance with an embodiment of the present invention.

In one or more embodiments, a portion of the metal liner 210 can be removed from the substrate 110 and from the sidewalls of the source/drain 170, where the portion of the metal liner 210 can be removed using an isotropic etch (e.g., wet chemical etch). The metal liner 210 can be removed from below portions of the planarization layer 220.

In one or more embodiments, a portion of the metal liner 210 can be removed from the protective blocks 185 and opposite sidewalls of the source/drain 170 to form gaps 255 between a portion of the planarization layer 220 and the isolation regions 115, and channels 257 adjacent to the sidewalls of the source/drain 170 and protective blocks 185, where the channels can extend along the sides of the source/drain and protective blocks. The portion of the metal liner 210 removed can control the length of the metal liner 210 on the sidewalls of the source/drain 170 and the interfacial area between the metal liner 210 and the source/drain 170, where the metal liner can cover less than the full length of each of the sidewalls of the source/drain(s). A portion of the metal liner 210 can remain on the sidewalls and top surface of the source/drain 170, where the portion of the metal liner 210 can cover a majority of the sidewalls of the source/drain(s) 170. In various embodiments, the metal liner 210 can cover at least half (½, or 50%) of the length of the sidewall of the source/drain 170, or at least two-thirds (⅔) of the length of the sidewall of the source/drain 170, or at least three-quarters (¾) of the length of the sidewall of the source/drain 170, where greater coverage can reduce resistance, but may increase capacitance. In various embodiments, the metal liner 210 can cover about half (½) the length of the sidewall of the source/drain 170 to about nine-tenths (⁹⁄₁₀, or 90%) the length of the sidewall of the source/drain 170, or about half (½) the length of the sidewall of the source/drain 170 to about four-fifths (⅘, or 80%) the length of the sidewall of the source/drain 170. The amount of surface area of the source/drain 170 covered by the metal liner 210 can balance the resistance and capacitance. The formation of the channels 257 adjacent to the sidewalls of the source/drain 170 can form a gap between the bottom edge(s) of the metal liner 210 and a top surface of the isolation regions 115, where a lower portion of the source/drain 170 is not covered by the metal liner 210.

Figure 16:
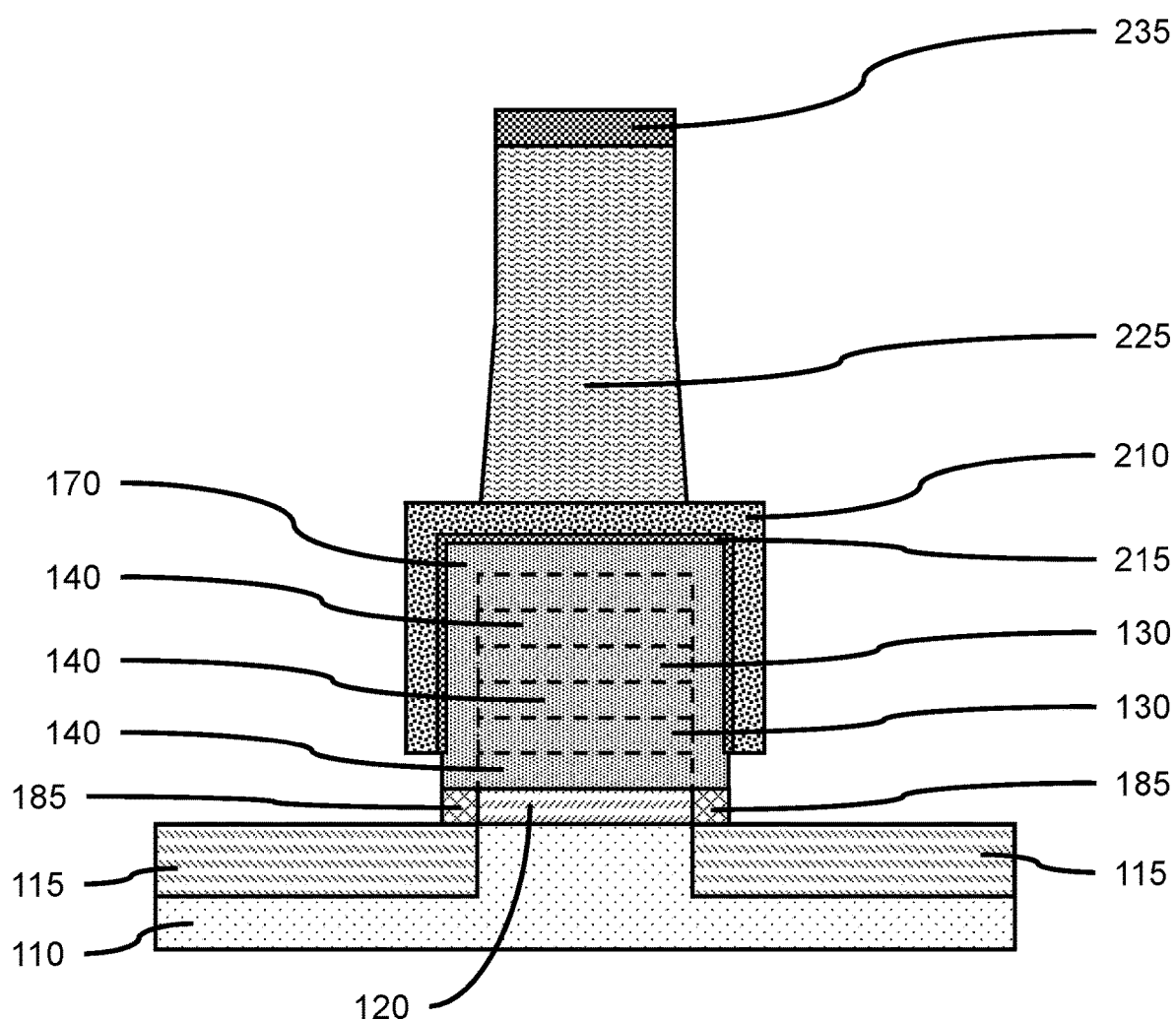
FIG. 16 is a cross-sectional side view showing the sidewall spacers and underlying portions of the planarization layer removed to form a planarization mesa on the metal liner and source/drain, in accordance with an embodiment of the present invention.

FIG. 16 is a cross-sectional side view showing the sidewall spacers and underlying portions of the planarization layer removed to form a planarization mesa on the metal liner and source/drain, in accordance with an embodiment of the present invention.

In one or more embodiments, the sidewall spacers 240 can be removed using a selective etch, for example, a wet chemical etch or dry plasma etch. The underlying portions of the planarization layer 220 can then be removed using a directional etch (e.g., RIE) to form a planarization mesa 225 between the anti-reflection coating (ARC) template 235 and the source/drain 170. Removal of the planarization layer 220 from the sidewalls of the metal liner 210 can expose a portion of the metal liner 210 on the source/drain 170. A lower portion of the source/drain 170 below the bottom edge of the metal liner 210 and the protective blocks 185 can also be exposed.

Figure 17:
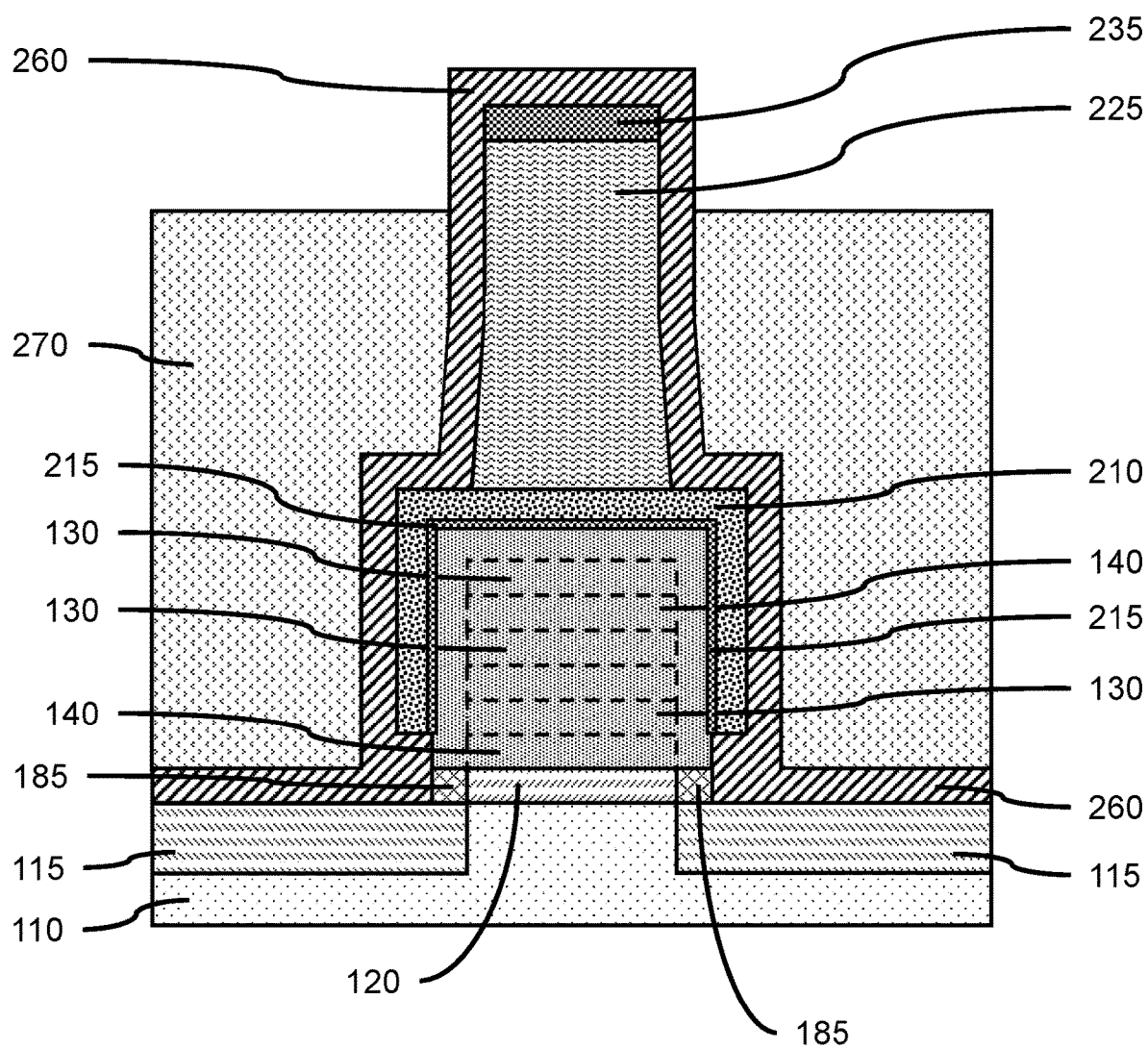
FIG. 17 is a cross-sectional side view showing a cover layer and dielectric fill formed on the substrate, metal liner, and the source/drain, in accordance with an embodiment of the present invention.

FIG. 17 is a cross-sectional side view showing a cover layer and dielectric fill formed on the substrate, metal liner, and the source/drain, in accordance with an embodiment of the present invention.

In one or more embodiments, a cover layer 260 can be formed on the exposed surfaces of the substrate 110, isolation regions 115, metal liner 210, protective blocks 185, and the source/drain 170, where the cover layer 260 can be formed by a conformal deposition (e.g., ALD, PEALD). The cover layer 260 can fill in the gaps between the lower edge of the metal liner 210 and the isolation regions 115, where the cover layer 260 can be on the lower portion of the source/drain 170 not covered by the metal liner 210.

In various embodiments, the cover layer 260 can be an electrically insulating dielectric material, including, but not limited to, silicon oxide (SiO), silicon nitride (SiN), silicon oxynitride (SiON), silicon carbide (SiC) silicon oxycarbide (SiOC), silicon carbonitride (SiCN), silicon oxy carbonitride (SiOCN), silicon boro carbonitride (SiBCN), and combinations thereof.

In various embodiments, the cover layer 260 can have a thickness in a range of about 1 nm to about 20 nm, or about 3 nm to about 8 nm, where the thickness of the cover layer 260 is sufficient to protect the metal liner 210 from being damaged or oxidized when an interlayer dielectric (ILD) fill material 270 is deposited.

In one or more embodiments, an ILD fill 270 can be formed on the cover layer 260 and substrate 110, where the ILD fill 270 can be formed by a blanket deposition, for example, chemical vapor deposition (CVD), plasma enhanced CVD (PECVD), spin-on, or a combination thereof.

In various embodiments, the dielectric fill 270 can be a dielectric material including but not limited to oxide or low-k dielectric (e.g., fluorine-doped silicon oxide (SiO:F), carbon-doped silicon oxide (SiO:C), etc.).

In various embodiments, the ILD fill 270 can be planarized and etched back to expose a portion of the cover layer 260, where the etch-back can be done using a selective directional etch (e.g., RIE). The interlayer dielectric (ILD) fill 270 can be etched back to below the anti-reflection coating (ARC) template 235 remaining on the planarization mesa 225 to expose a portion of the cover layer 260.

Figure 18:
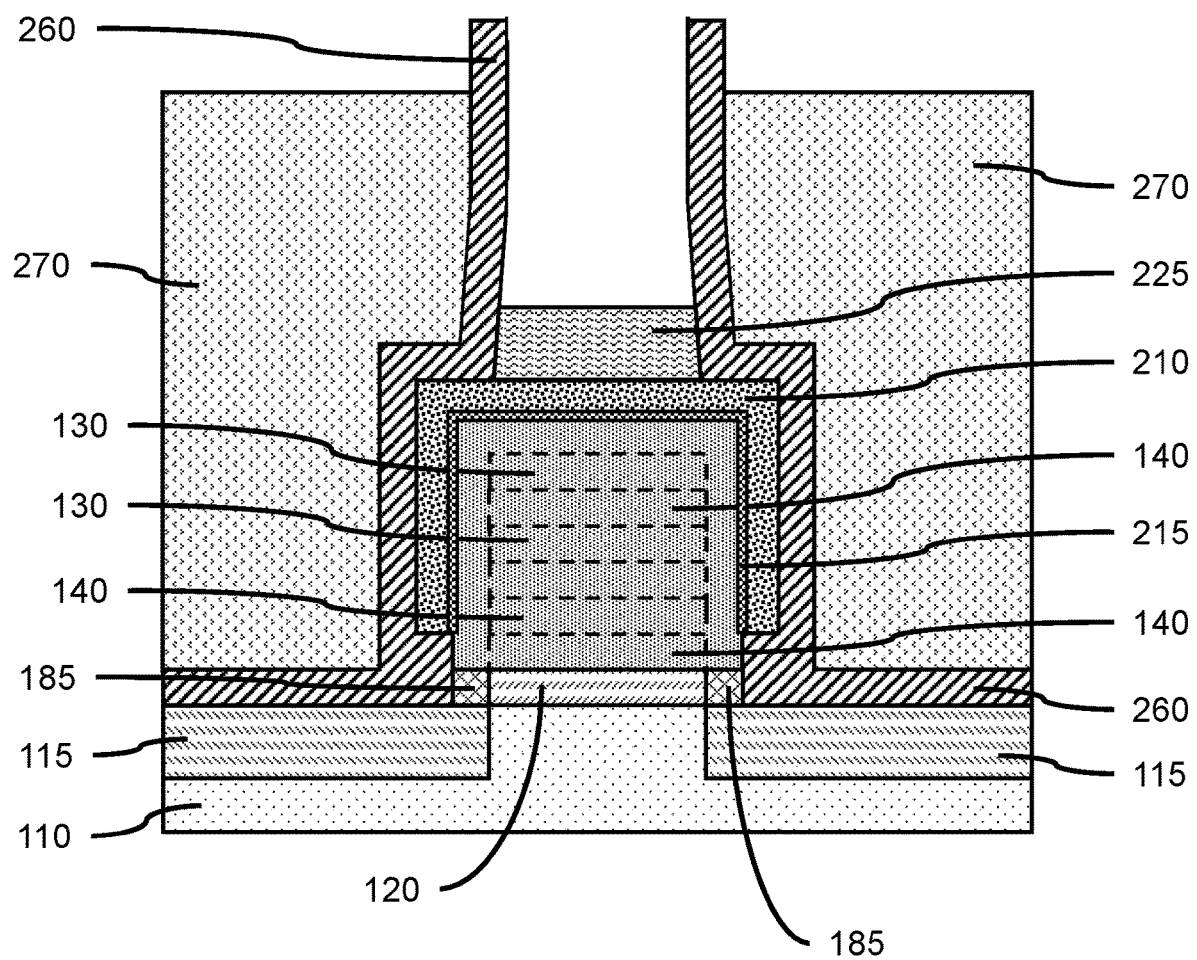
FIG. 18 is a cross-sectional side view showing a portion of the cover layer removed and planarization mesa etched back, in accordance with an embodiment of the present invention.

FIG. 18 is a cross-sectional side view showing a portion of the cover layer removed and planarization mesa etched back, in accordance with an embodiment of the present invention.

In one or more embodiments, a section of the exposed portion of the cover layer 260 can be removed from the anti-reflection coating (ARC) template 235, and the anti-reflection coating (ARC) template 235 can be removed using etching to expose the planarization mesa 225. The section of the exposed portion of the cover layer 260 can be removed using a selective directional etch (e.g., RIE).

In various embodiments, the planarization mesa 225 can be etched back using a selective directional etch (e.g., RIE).

Figure 19:
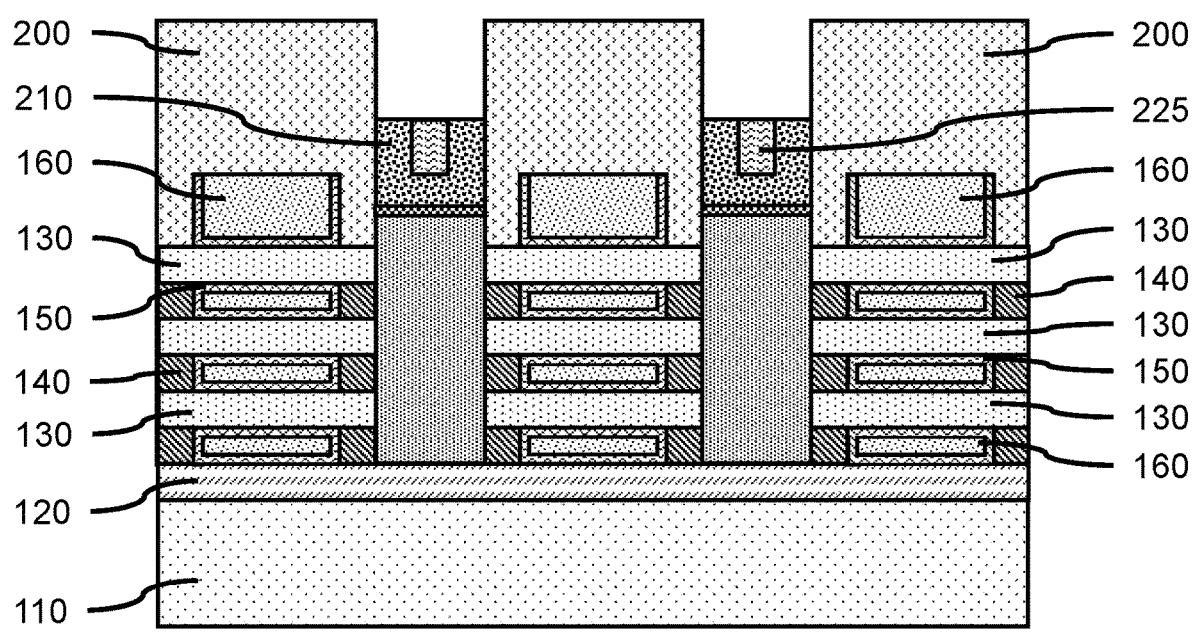
FIG. 19 is a cross-sectional side view perpendicular to FIG. 18 showing the remaining portions of the planarization mesa and metal liner on the source/drains, in accordance with an embodiment of the present invention.

FIG. 19 is a cross-sectional side view perpendicular to FIG. 18 showing the remaining portions of the planarization mesa and metal liner on the source/drains, in accordance with an embodiment of the present invention.

In one or more embodiments, the planarization mesa 225 can be etched back to expose portions of the metal liner 210 above the source/drains 170. The metal liner 210 can be etched back using a selective etch to the height of the etched-back planarization mesa 225.

Figure 20:
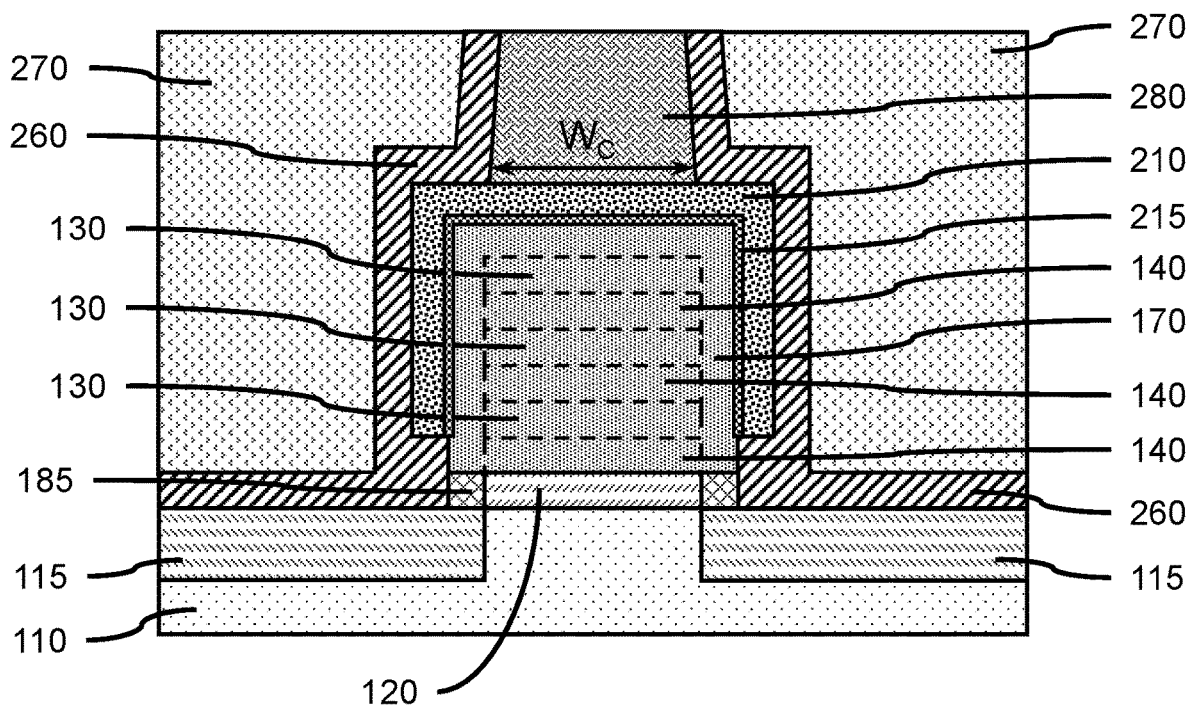
FIG. 20 is a cross-sectional side view showing the remaining portion of the planarization mesa removed and a conductive contact formed on the metal liner, in accordance with an embodiment of the present invention.

FIG. 20 is a cross-sectional side view showing the remaining portion of the planarization mesa removed and a conductive contact formed on the metal liner, in accordance with an embodiment of the present invention.

In one or more embodiments, the remaining portion of the planarization mesa 225 can be removed from the metal liner 210 to expose the metal liner on the source/drain 170. The planarization mesa 225 can be removed using a selective etch.

In one or more embodiments, a conductive contact 280 can be formed on the exposed surface of the metal liner 210 and sidewalls of the remaining portion of the cover layer 260. The conductive contact 280 can fill in a recess formed between the sections of the metal liner 210 on the sidewalls of the remaining portion of the cover layer 260. In various embodiments, the conductive contact 280 can be a metal, including, but not limited to, tungsten (W), ruthenium (Ru), Cobalt (Co), copper (Cu), aluminum (Al), and combinations thereof. The conductive contact 280 can be a conductive material different from the conductive material of the metal liner 210.

In various embodiments, the conductive contact 280 has a width, $W_C$, at the interface with the top surface of the metal liner 210, where the width of the conductive contact 280 can be less than the width of the metal liner 210. In various embodiments, the conductive contact 280 has a width, $W_C$, on the top surface of the metal liner 210, where the width of the conductive contact 280 can be less than the width of the source/drain 170.

Figure 21:
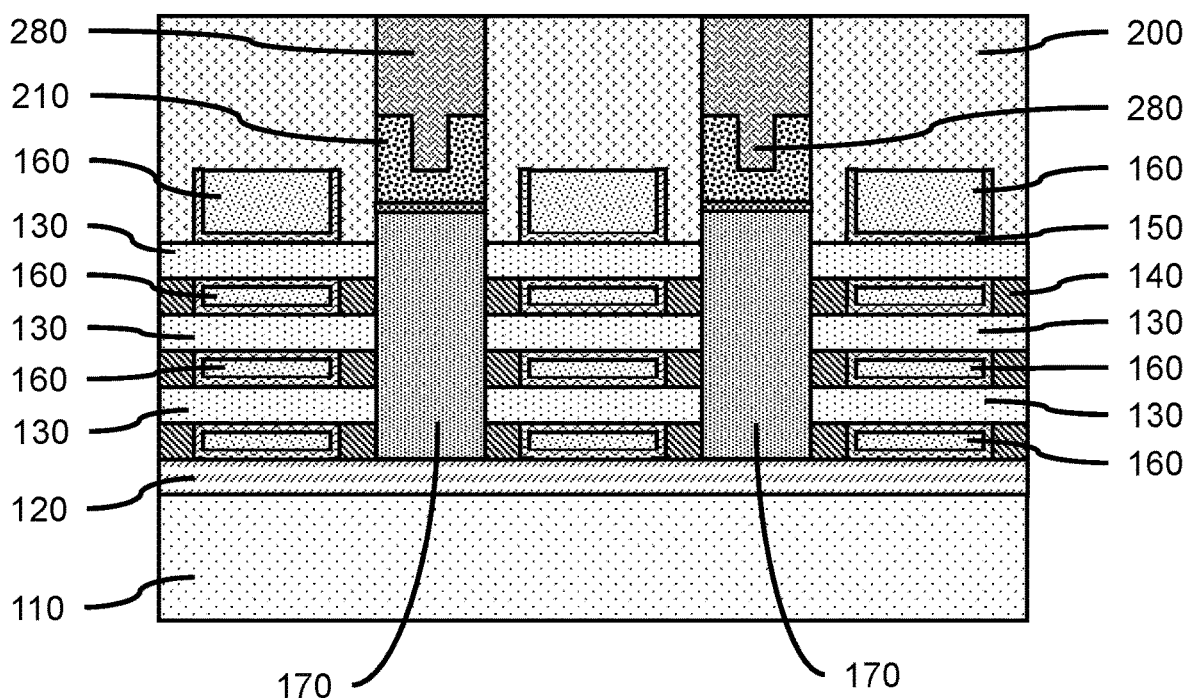
FIG. 21 is a cross-sectional side view perpendicular to FIG. 20 showing the conductive contact formed on the metal liner, in accordance with an embodiment of the present invention.

FIG. 21 is a cross-sectional side view perpendicular to FIG. 20 showing the conductive contact formed on the metal liner, in accordance with an embodiment of the present invention.

In various embodiments, the conductive contact 280 can fill in the space between portions of the metal liner 210 on the sidewalls of gate cap 200 and cover the metal liner 210.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method of fabricating a device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A field effect transistor, comprising:
    a first source/drain on a substrate;
    a second source/drain on the substrate;
    a channel region between the first source/drain and the second source/drain;
    a metal liner on at least three sides of the first source/drain and/or the second source/drain, wherein the metal liner covers less than the full length of a sidewall of the first source/drain and/or the second source/drain, and wherein the metal liner has a width, $W_L$, on a top surface of the first source/drain and/or the second source/drain that is greater than a width of the underlying source/drain;
    a metal-silicide between the metal liner and the first source/drain and/or the second source/drain; and
    a conductive contact on the metal liner on the first source/drain and/or the second source/drain, wherein the conductive contact is a conductive material different from a conductive material of the metal liner.

2. The field effect transistor of claim 1, further comprising a gate structure on the channel region, and wherein the metal liner has a thickness in a range of about 2 nm to about 15 nm.

3. The field effect transistor of claim 2, wherein the metal liner is a conductive silicide forming metal selected from the group consisting of titanium (Ti), nickel (Ni), nickel-platinum (NiPt), and combinations thereof.

4. The field effect transistor of claim 3, wherein the conductive contact is a conductive metal selected from the group consisting of tungsten (W), ruthenium (Ru), Cobalt (Co), copper (Cu), and aluminum (Al), and wherein the conductive contact has a width, $W_C$, at an interface with a top surface of the metal liner that is less than the width of the metal liner, $W_L$.

5. The field effect transistor of claim 2, wherein the gate structure includes a gate dielectric layer on the channel region and a conductive gate fill on the gate dielectric layer.

6. The field effect transistor of claim 5, wherein the gate dielectric layer is hafnium oxide (HfO), and the conductive gate fill is a conductive material selected from the group consisting of copper (Cu), Cobalt (Co), tungsten (W), molybdenum (Mo), titanium-aluminum (TiAl), titanium nitride (TiN), tantalum nitride (TaN), tungsten nitride (WN), hafnium nitride (HfN), titanium carbide (TiC), tantalum carbide (TaC), tungsten carbide (WC), hafnium carbide (HfC), titanium aluminum carbide (TiAlC), and combinations thereof.

7. The field effect transistor of claim 5, further comprising one or more nanosheet channel layer(s) between the first source/drain and the second source/drain, wherein the one or more nanosheet channel layer(s) form the channel region.

8. The field effect transistor of claim 7, further comprising an insulating bottom spacer layer between the first source/drain and/or the second source/drain and a portion of the substrate.

9. The field effect transistor of claim 8, further comprising protective blocks between an edge portion of the first source/drain and/or the second source/drain and an isolation region on each of opposite sides of the portion of the substrate below the insulating bottom spacer layer.

10. A field effect transistor, comprising:
    a first source/drain on a substrate;
    a second source/drain on the substrate;
    a channel region between the first source/drain and the second source/drain;
    a first metal liner on at least three sides of the first source/drain, wherein the first metal liner covers about half (½) to about nine-tenths (9/10) the length of a sidewall of the first source/drain;
    a second metal liner on at least three sides of the second source/drain, wherein the second metal liner covers about half (½) to about nine-tenths (9/10) the length of a sidewall of the second source/drain;
    a first metal-silicide layer between the first metal liner and the first source/drain, and a second metal-silicide layer between the second metal liner and the second source/drain, wherein the first source/drain and the second source/drain each have amorphized surfaces adjoining the first metal-silicide layer and second metal-silicide layer;
    a first conductive contact on the first metal liner on the first source/drain, wherein the first conductive contact is a conductive material different from the conductive material of the first metal liner;
    a second conductive contact on the second metal liner on the second source/drain, wherein the second conductive contact is a conductive material different from the conductive material of the second metal liner; and
    a first cover layer on the first metal liner and first conductive contact, wherein a portion of the first cover layer separates the first metal liner and an isolation region on the substrate.

11. The field effect transistor of claim 10, wherein each of the first and second metal-silicide layers have a thickness in a range of 2 nm to about 6 nm, and each of the first and second metal liners have a thickness in a range of about 3 nm to about 12 nm.

12. The field effect transistor of claim 10, further comprising a second cover layer on the second metal liner and second conductive contact, wherein a portion of the second cover layer separates the second metal liner from the isolation region on the substrate.

13. The field effect transistor of claim 10, further comprising an insulating bottom spacer layer between the first source/drain and the second source/drain and a portion of the substrate.

14. The field effect transistor of claim 13, further comprising a protective block adjacent to the insulating bottom spacer layer and between an edge portion of the first source/drain and the isolation region in the substrate.

15. The field effect transistor of claim 14, further comprising a second cover layer on the second metal liner and second conductive contact, wherein a portion of the second cover layer is between the second metal liner and the isolation region.

16. The field effect transistor of claim 15, wherein a gate structure on the channel region includes a gate dielectric layer on the channel region and a conductive gate fill on the gate dielectric layer.

17. A method of forming a field effect transistor, comprising:
    forming a channel region on a substrate;
    forming a first source/drain and a second source/drain on opposite sides of the channel region;

amorphizing the surfaces on at least three sides of the first source/drain and the second source/drain by an ion bombardment;

forming a first metal liner on at least three sides of the first source/drain and a second metal liner on at least three sides of the second source/drain;

forming a first metal-silicide layer between the first metal liner and the first source/drain, and a second metal-silicide layer between the second metal liner and the second source/drain;

forming a first cover layer on the first metal liner, wherein a portion of the first cover layer is between the first metal liner and an isolation region on the substrate;

forming a second cover layer on the second metal liner, wherein a portion of the second cover layer is between the second metal liner and the isolation region on the substrate; and forming a first conductive contact on the first metal liner on the first source/drain and a second conductive contact on the second metal liner on the second source/drain.

18. The method of claim 17, further comprising forming an insulating bottom spacer layer on the substrate, wherein the first source/drain, the channel region, and the second source/drain, are on the insulating bottom spacer layer.

19. The method of claim 18, wherein each of the first and second metal-silicide layers have a thickness in a range of 2 nm to about 6 nm, and each of the first and second metal liners have a thickness in a range of about 3 nm to about 12 nm.

20. The method of claim 19, wherein the first metal liner covers about half (½) to about nine-tenths (9/10) the length of each of the sidewalls of the first source/drain.

* * * * *